US012694914B2

(12) United States Patent
Yoo et al.

(10) Patent No.: US 12,694,914 B2
(45) Date of Patent: Jul. 28, 2026

(54) MEMORY DEVICE INCLUDING PIPE LATCH

(71) Applicant: SK hynix Inc., Gyeonggi-do (KR)

(72) Inventors: Young Seung Yoo, Gyeonggi-do (KR); Ji Seong Mun, Gyeonggi-do (KR); Hyeon Cheon Seol, Gyeonggi-do (KR); Sung Hwa Ok, Gyeonggi-do (KR); Sung Wook Cho, Gyeonggi-do (KR); Kyeong Min Chae, Gyeonggi-do (KR); Hyun Kyu Kang, Gyeonggi-do (KR); Won Keun Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 228 days.

(21) Appl. No.: 18/436,021

(22) Filed: Feb. 8, 2024

(65) Prior Publication Data

US 2025/0124957 A1    Apr. 17, 2025

(30) Foreign Application Priority Data

Oct. 13, 2023    (KR) ........................ 10-2023-0136682

(51) Int. Cl.
*G11C 16/34*          (2006.01)
*G11C 7/10*           (2006.01)
(52) U.S. Cl.
CPC ................................. *G11C 7/1039* (2013.01)
(58) Field of Classification Search
CPC .................................................... G11C 7/1039
See application file for complete search history.

(56) References Cited

U.S. PATENT DOCUMENTS

| | | | | |
|---|---|---|---|---|
| 4,302,775 A | * | 11/1981 | Widergren | ........... H04N 19/126 |
| | | | | 375/240.06 |
| 6,064,625 A | * | 5/2000 | Tomita | ................. G11C 7/1039 |
| | | | | 365/189.16 |
| 6,288,947 B1 | | 9/2001 | Kim et al. | |
| 6,694,416 B1 | * | 2/2004 | Thomann | ............. G11C 7/1051 |
| | | | | 710/21 |
| 6,772,312 B2 | * | 8/2004 | Mes | .................... G11C 11/4076 |
| | | | | 713/400 |
| 7,256,634 B2 | | 8/2007 | Masleid | |
| 9,679,620 B1 | * | 6/2017 | Yun | ......................... G11C 7/062 |
| 10,762,933 B2 | * | 9/2020 | Kim | .................... G11C 7/1066 |
| 2001/0044888 A1 | * | 11/2001 | Li | ....................... G06F 13/4243 |
| | | | | 711/167 |

(Continued)

FOREIGN PATENT DOCUMENTS

| | | |
|---|---|---|
| KR | 10-0819662 B1 | 4/2008 |
| KR | 10-2016-0076204 A | 6/2016 |
| WO | 97/15116 A2 | 4/1997 |

*Primary Examiner* — Douglas King
(74) *Attorney, Agent, or Firm* — IP & T GROUP LLP

(57) ABSTRACT

A pipeline system includes a first inverter latch configured to receive plural data entries, and plural second inverter latches coupled to each other in parallel for storing the plural data entries input from the first inverter latch in a distributive manner. Plural first switches are arranged between the first inverter latch and the plural second inverter latches, each first switch configured for controlling transmission of each of the plural data entries from the first inverter latch to one of the plural second inverter latches. Plural second switches are configured to output the plural data entries stored in the plural second inverter latches.

18 Claims, 6 Drawing Sheets

(56)　　　　　　References Cited

U.S. PATENT DOCUMENTS

| | | | |
|---|---|---|---|
| 2003/0217225 A1* | 11/2003 | Jang | G06F 13/1689 |
| | | | 711/105 |
| 2007/0070676 A1* | 3/2007 | Kim | G11C 19/28 |
| | | | 365/189.05 |
| 2007/0070715 A1* | 3/2007 | Kim | G11C 7/20 |
| | | | 365/189.05 |
| 2011/0292746 A1* | 12/2011 | Chu | H03K 3/356139 |
| | | | 365/189.05 |
| 2015/0098283 A1* | 4/2015 | Ku | G11C 7/1039 |
| | | | 327/198 |
| 2016/0224480 A1* | 8/2016 | Ku | G06F 13/4204 |
| 2017/0075757 A1* | 3/2017 | Im | G06F 11/1068 |
| 2018/0336936 A1* | 11/2018 | Chae | G11C 7/1066 |

* cited by examiner

FIG. 3

MEMORY DEVICE INCLUDING PIPE LATCH

CROSS-REFERENCE TO RELATED APPLICATIONS

This patent application claims the benefit of priority under 35 U.S.C. § 119 (a) to Korean Patent Application No. 10-2023-0136682, filed on Oct. 13, 2023, the entire disclosure of which is incorporated herein by reference.

TECHNICAL FIELD

One or more embodiments of the present disclosure described herein relate to a memory device, and more particularly, to a memory device including a pipe latch configured to input or output plural data entries.

BACKGROUND

Memory devices are typically provided in a computer or other electronic devices as internal, semiconductor, integrated circuit, and/or external removable devices. There are various types of memory, including a volatile memory and a non-volatile memory. The volatile memory may require power to retain data. The volatile memory may include a random access memory (RAM), a dynamic random access memory (DRAM), a static random access memory (SRAM), and a synchronous dynamic random access memory (SDRAM). The non-volatile memory may retain stored data when power is not supplied. The non-volatile memory may include a NAND flash memory, a NOR flash memory, a Phase Change Random Access Memory (PCRAM), a Resistive Random Access Memory (RRAM), and a Magnetic Random Access Memory (MRAM). When data entries stored in a memory device are continuously output or an external device continuously inputs data entries into the memory device, a plurality of pipe latches may be included to temporarily store and transfer the continuously input/output data entries.

BRIEF DESCRIPTION OF THE DRAWINGS

The description herein makes reference to the accompanying drawings wherein like reference numerals refer to like parts throughout the figures.

FIG. 3 illustrates a first embodiment of pipe latches according to the present disclosure.

DETAILED DESCRIPTION

Figure 1:
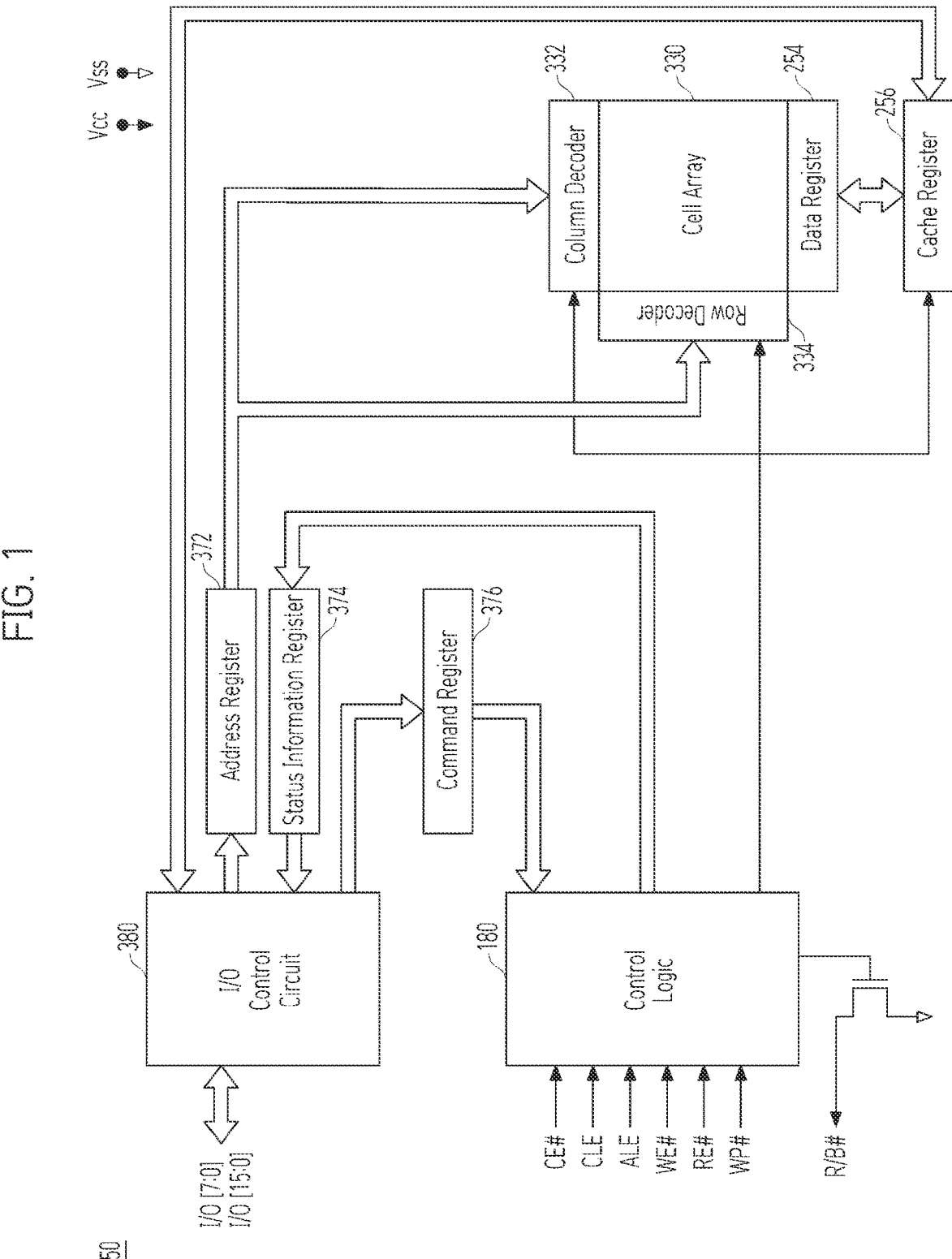
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in a manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory (ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or a portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Embodiments of the present disclosure may provide a pipe latch that can reduce an error in a data transfer process in a memory device that inputs and outputs a plurality of data entries.

In addition, an embodiment of the present disclosure can reduce a size of the pipe latch by reducing the number of transistors constituting the pipe latch and reduce power consumed by the pipe latch, thereby providing a memory device suitable for low-power or high-speed operation environments.

One embodiment of the present disclosure can provide a low-power, highly integrated pipe latch that configures an asynchronous pipelining system to increase a system throughput by enhancing parallelism in plural operations carried out by a high-performance processor, a multimedia and graphics device, or a signal processor.

In an embodiment of the present disclosure, a pipeline system can include a first inverter latch configured to receive plural data entries; plural second inverter latches coupled to each other in parallel for storing the plural data entries input from the first inverter latch in a distributive manner; plural first switches arranged between the first inverter latch and the plural second inverter latches, each first switch configured for controlling transmission of each of the plural data entries from the first inverter latch to one of the plural second inverter latches; and plural second switches configured to output the plural data entries stored in the plural second inverter latches.

In the pipeline system, each of the plural first switches comprises a pass gate operating in response to a pipe input signal and an inverted pipe input signal.

In the pipeline system, the plural first switches can be controlled by plural pipe input signals which are sequentially activated based on a clock signal. Each of the plural second switches can include a transistor operating in response to a pipe output signal.

In the pipeline system, the pipeline system can further include a tri-state inverter configured to control transmission of the plural data entries into the first inverter latch based on a clock signal. The first inverter latch and the plural second inverter latches can have a substantially same structure.

In the pipeline system, each of the second inverter latches can include four transistors including each two transistors having gates cross-coupled to each other; and a pull-down driver coupled to the four transistors. The pull-down driver can include an NMOS transistor. The four transistors can include two PMOS transistors and two NMOS transistors.

In another embodiment, a memory device can include a first input and output circuit configured to input or output plural data entries to or from a cell array comprising plural memory cells; a pipe latch coupled to the first input and output circuit and configured to perform a parallel processing of the plural data entries based on a clock signal; and a second input and output circuit coupled to the pipe latch and configured to input or output the plural data entries. The pipe latch can include a first inverter latch configured to receive the plural data entries; and plural second inverter latches coupled in parallel and configured to store the plural data entries input from the first inverter latch in a distributive manner and output the stored plural data entries.

The pipe latch can include plural first switches arranged between the first inverter latch and the plural second inverter latches, each first switch configured to control transmission of each of the plural data entries from the first inverter latch to one of the plural second inverter latches; and plural second switches configured to output the plural data entries stored in the plural second inverter latches.

In the memory device, each of the plural first switches can include a pass gate operating in response to a pipe input signal and an inverted pipe input signal.

In the memory device, the plural first switches can be controlled by plural pipe input signals which are sequentially activated based on a clock signal. Each of the plural second switches can include a transistor operating in response to a pipe output signal.

In the memory device, the pipe latch can further include a tri-state inverter configured to control transmission of the plural data entries into the first inverter latch based on a clock signal. The first inverter latch and each of the plural second inverter latches can have a substantially same structure.

In the memory device, each of the second inverter latches can include four transistors including each two transistors having gates cross-coupled to each other; and a pull-down driver coupled to the four transistors. The pull-down driver can include an NMOS transistor. The four transistors can include two PMOS transistors and two NMOS transistors.

In the memory device, the first input and output circuit can include a sense amplifier, and the second input and output circuit can include a chip select decoder.

These and other features and advantages of the invention will become apparent from the detailed description and the accompanying drawings of embodiments of the present disclosure. Embodiments will now be described with reference to the accompanying drawings, wherein like numbers reference like elements.

FIG. 1 illustrates a memory device 150 according to an embodiment of the present disclosure.

Referring to FIG. 1, the memory device 150 can include at least one memory die. The memory device 150 can receive or output a plurality of control signals CE#, CLE, ALE, WE#, RE#, WP#, R/B#, and receive or transmit data or operation information through channels I/O[7:0], I/O[15:0]. For example, a predetermined amount of data (e.g., 1 byte (8 bits) or 2 bytes (16 bits)) can be transmitted and received according to a channel (e.g., I/O[7:0], I/O[15:0]) connecting the memory device 150 and a controller.

According to an embodiment, the memory device 150 can include a plurality of pins or pads. For example, the plurality of control signals CE#, CLE, ALE, WE#, RE#, WP#, R/B# can be transmitted or received through exclusively allocated pins. The control signals can include a chip enable signal CE#, a command latch enable signal CLE, an address latch enable signal ALE, a write enable signal WE #, a read enable signal RE#, a write protect signal WP#, a status signal R/B# indicating a ready state or a busy state, and the like. The control signals CE#, CLE, ALE, WE#, RE#, WP#, R/B# can be controlled (transmitted and received) by a control logic 180 in the memory device 150.

The memory device 150 can include an input and output (input/output (I/O)) control circuit 380. The input/output control circuit 380 can be connected to other devices or components (e.g., a controller) through the channels I/O[7: 0], I/O[15:0]. The input/output control circuit 380 in the memory device 150 can be coupled to a plurality of registers 372, 374, 376 and a cache register 256 coupled to a cell array 330.

According to an embodiment, the input/output control circuit 380 can include a chip select decoder, while the memory device 150 may include a plurality of memory chips. Chip select function may be used to activate one of the plurality of memory chips included in or connected to a memory system or a data processing system. Depending on the embodiment, the chip select decoder may be imple- mented with combinational logic gates that activate one specific output line in response to an input binary code. The memory system or the data processing system can use an activated output line to activate or "select" a specific chip or device from multiple devices connected to the memory system or the data processing system. For example, if there are multiple memory chips on a same bus (such as flash memory chips in solid state drives (SSDs)), for most opera- tions it is impossible to communicate with all memory chips simultaneously because data entries or commands sent across the bus could be routed to all memory chips. Instead, a chip select signal can be used to select which chip to communicate with at any given time. The chip select decoder can manage and control data communication between multiple devices (e.g., the multiple memory chips) that share the same bus or connection lines in a system by activating one specific device based on an input select code/signal.

According to an embodiment, the memory device 150 may include the cache register 256, an address register 372, a status information register 374, and a command register 376. The cache register 256 can temporarily store data. When the memory device 150 performs a read operation, the cache register 256 can store a read data entry output from the cell array 330. When the memory device 150 performs a write operation or a program operation, the cache register 256 can store a write data entry. The address register 372 can store an address indicating a location of the cell array 330 where a read operation or a write operation is to be per- formed. The command register 376 can store a command to be executed by the memory device 150. The status infor- mation register 374 can store status information such as a result (failure/success) of an operation performed in the memory device 150 or readiness for performing an opera- tion. For example, when a plurality of memory planes is included in a memory die in the memory device 150, the status information register 374 can store status information regarding each of the plurality of memory planes. Data, commands, and information transmitted or received through the input/output control circuit 380 in the memory device 150 can be controlled (e.g., transmitted, moved, or output) by the control logic 180.

During a read operation in the memory device 150, a row decoder 334 and a column decoder 332 can select one or more memory cells in the cell array 330 based on an address stored in the address register 372 and a control signal from the control logic 180. During a read operation, a read data entry output from the cell array 330 may be stored in the data register 254 and then transferred from the data register 254 to the cache register 256. The read data entry stored in the cache register 256 is transferred to the input/output control circuit 380 through input/output lines. The read data entry transmitted to the input/output control circuit 380 can be output to the controller through the channels I/O[7:0], I/O [15:0].

During a write operation or a program operation in the memory device 150, the row decoder 334 and the column decoder 332 can select one or more memory cells in the cell array 330 in response to an address stored in the address register 372 and a control signal from the control logic 180. During the write operation, the write data entry transferred from the controller to the input/output control circuit 380 through the channels I/O[7:0], I/O[15:0] can be stored in the cache register 256. Thereafter, the write data entry can be transferred from the cache register 256 to the data register 254. The write data entry stored in the data register 254 can be programmed in selected memory cells in the cell array 330 by the control logic 180.

The data register 254 and the cache register 256 can be included in a read/write circuit comprising a sense amplifier, a page buffer, or the like. According to an embodiment, page buffers or data latches included in the memory device 150 can correspond to the data register 254 and/or the cache register 256. Further, the cache register 256 is configured to temporarily store data transmitted between the data register 254 and the input/output control circuit 380. The cache register 256 may have a pipe latch structure depending on the embodiment.

A pipeline (or pipelining) system including at least one pipe latch can include an apparatus that can parallelize a plurality of data entries input and output serially. According to an embodiment, the pipeline system is applicable to the input/output control circuit 380 or the cache register 256. Further, according to an embodiment, the pipeline system may be used to compensate for delays and noise occurring in a data transmission process as a data path through which data is transmitted within the memory device 150 of the memory system becomes longer.

Figure 2:
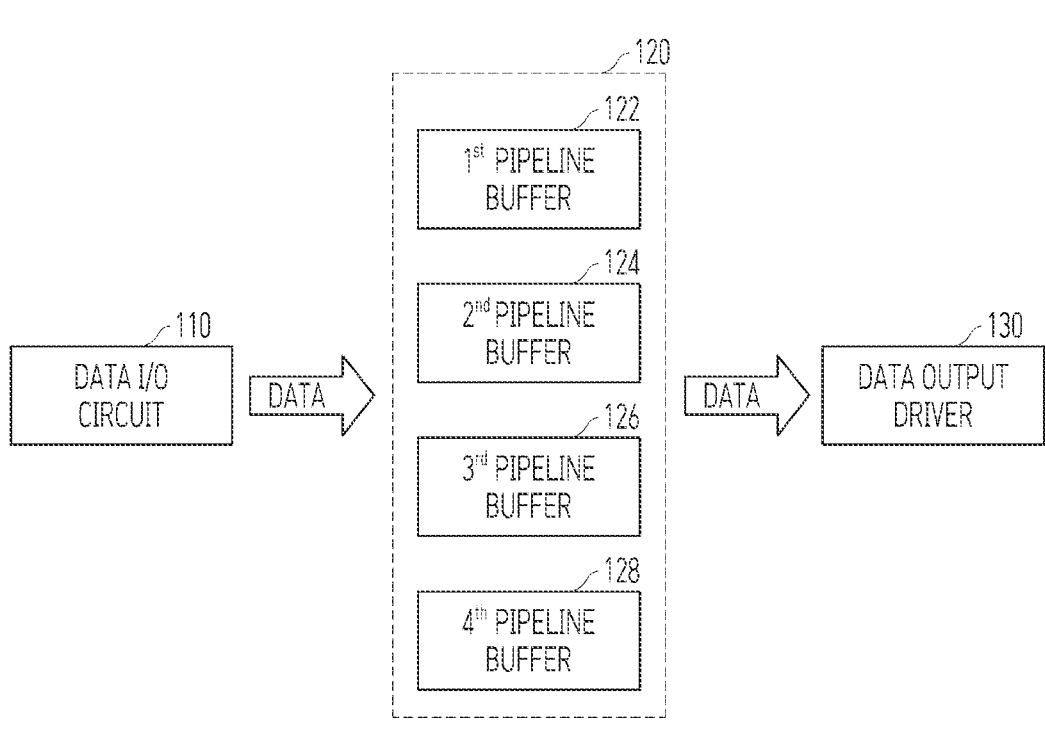
FIG. 2 illustrates a pipeline system according to an embodiment of the present disclosure.

FIG. 2 illustrates a pipeline system 120 according to an embodiment of the present disclosure.

Referring to FIG. 2, the pipeline system 120 can include a plurality of pipeline buffers 122, 124, 126, 128 which are disposed between a data input and output (input/output (I/O)) circuit 110 into which a data entry is input and a data output driver 130 which outputs the data entry. The data input/output circuit 110 and the data output driver 130 can sequentially transfer the data entry (i.e., data input/output), while the plurality of pipeline buffers 122, 124, 126, 128 are connected in parallel for temporarily storing data entries.

The plurality of pipeline buffers 122, 124, 126, 128 may correspond to pipeline latches, pipelining latches, or pipe latches used to store data entries between pipeline stages in a digital system. The plurality of pipeline buffers 122, 124, 126, 128 having a pipeline structure can generally maintain and store a data entry for one clock cycle. A pipe latch (or pipeline register) can hold an output of one stage until the start of the next clock cycle, at which point it can be provided as input to a next stage. In the memory device or the memory system that inputs and outputs a data entry at high speed, the plurality of pipeline buffers 122, 124, 126, 128 may be used to secure an operation margin for data transmission. Further, the plurality of pipeline buffers 122, 124, 126, 128 may be used to transfer data entries to a plurality of components within the memory device 150.

Referring to FIGS. 1 and 2, data transmission in the memory device 150 may be performed in response to a reference signal. An example of a typically used reference signal is a clock signal. Data entries can be transmitted between a plurality of components according to an externally input clock signal or an internally generated clock signal. Likewise, the plurality of pipeline buffers 122, 124, 126, 128 can input and output data entries in response to the clock signal.

A data path through which data entries are transmitted within the memory device 150 and a clock path through which the clock signal is transmitted are not the same. There may be a voltage difference (e.g., a potential difference) between the data entries and the clock signal, and components in which the clock signal and the data entries are used may also be different. Therefore, a phase difference (or a time difference) between the data entries and the clock signal may occur due to a noise or a delay occurring in the data path and the clock path. If there is sufficient margin for transmission of the data entries and the clock signal, the phase difference or the time difference caused by noises or delays might not cause malfunction of the memory device 150. However, because transmission margin of data entries and clock signals in the memory device 150 operating at high speed is neither large nor wide, the phase difference or the time difference caused by noises or delays may cause malfunctions.

The plurality of pipeline buffers 122, 124, 126, 128 included in the pipeline system 120 applicable to the memory device 150 operating at high speed may include an edge-triggered latch. An edge-triggered flip-flop (or the edge-triggered latch) may include a digital circuit configured to store and change a data entry (e.g., an output value or an output signal) based on characteristics of the clock input. The edge-triggered flip-flops can be broadly divided into two types: a positive edge-triggered latch and a negative-edge triggered latch. The positive edge-triggered latch can transfer an input signal to an output signal on a rising edge (low-to-high transition) of the clock signal. On the other hand, the negative-edge triggered latch can transfer an input signal to an output signal on a falling edge (high-to-low transition) of the clock signal. Edge triggering can avoid or prevent issues such as glitches or race conditions that can occur with level-triggered latches (e.g., latches whose changes occur whenever an enabling signal is input). In the edge-triggered latch, output changes occur only at specific points as the clock signal is changed from low to high (i.e., rising edge) or high to low (i.e., falling edge).

When the edge-triggered latch is applied to the pipelining system 120, a replica circuit can be used to compensate for delays in the data path through which the data entries are transmitted and the clock path through which the clock signal is transmitted, so that synchronization between the data entries and the clock signal could be achieved efficiently. Particularly, changes in a manufacturing process and an operating environment of the memory device 150 or the pipeline system 120 (e.g., process, voltage and temperature (PVT) variations) could be applied equally to the data entries and the clock signal, improving operation safety in data transmission.

Figure 3:
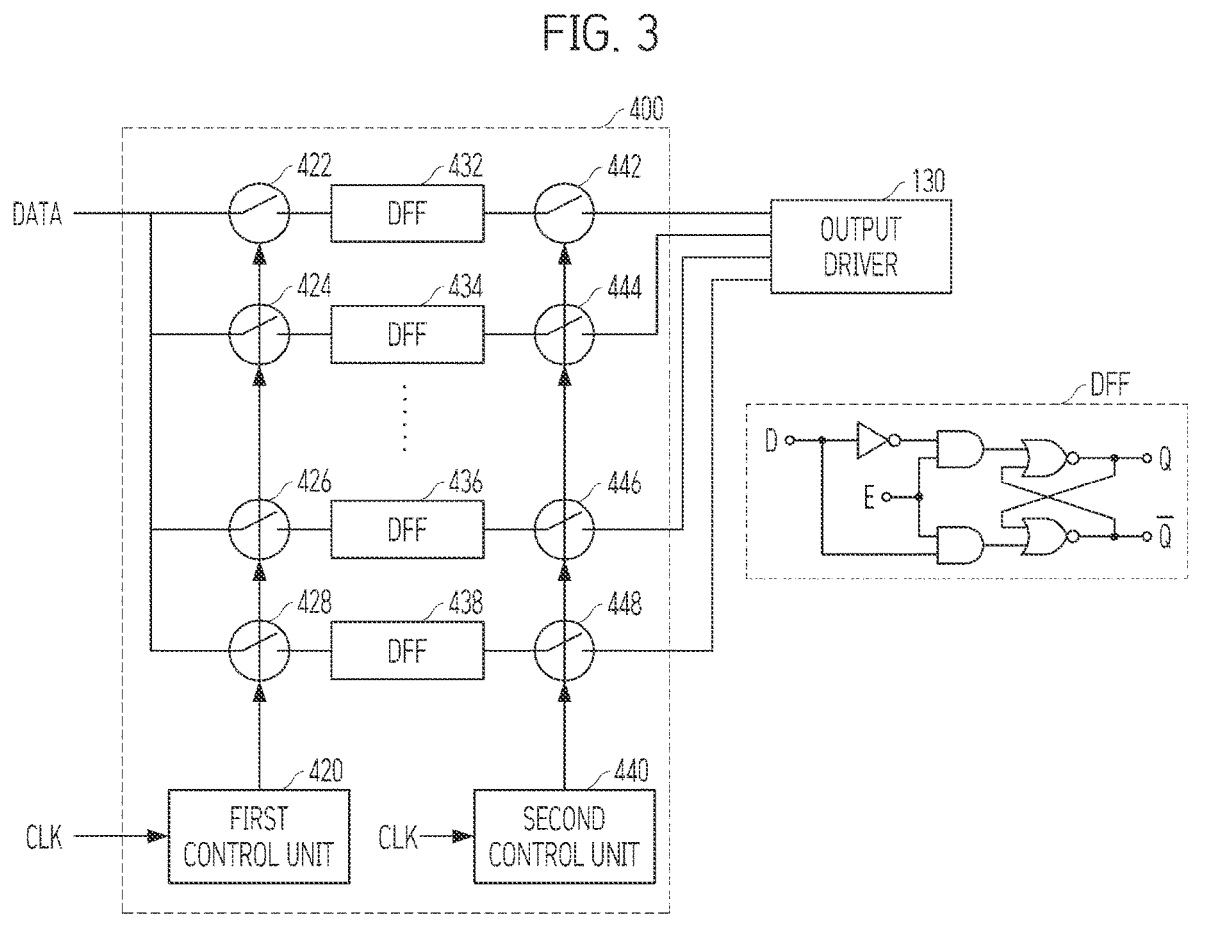

FIG. 3 illustrates a first embodiment of pipe latches according to the present disclosure.

Referring to FIG. 3, a pipe latch 400 may include a plurality of edge-triggered latches 432, 434, 436, 438. According to an embodiment, each of the plurality of edge-triggered latches 432, 434, 436, 438 may include a D flip-flop (DFF). The D flip-flop (DFF) can receive input data (D) and input clock (E). The input data (D) can be delayed until a next active clock appears (e.g., a specific change of the input clock (E) is recognized). Then, delayed data can be output as an output signal or value (Q, /Q) from the D flip-flop (DFF).

The plurality of edge-triggered latches 432, 434, 436, 438 may be coupled in parallel. The plurality of edge-triggered latches 432, 434, 436, 438 can be coupled between a plurality of first switches 422, 424, 426, 428 that control data input and a plurality of second switches 442, 444, 446, 448 that control output of the stored data entries. Each of the plurality of edge-triggered latches can store or transmit the data entries through the first switch and the second switch.

The pipe latch 400 can include a first control unit 420 and a second control unit 440. The first control unit 420 outputs a plurality of first control signals that control the plurality of first switches 422, 424, 426, 428. The second control unit 440 outputs a plurality of second control signals that control the plurality of second switches 442, 444, 446, 448. According to an embodiment, the plurality of first control signals and the plurality of second control signals may be respectively generated by the first control unit 420 and the second control unit 440 in response to a clock signal CLK.

While the plurality of data entries DATA is sequentially input, the plurality of first control signals can be sequentially activated. The plurality of data entries DATA may be distributed and stored in the plurality of edge-triggered latches 432, 434, 436, 438 through the plurality of first switches 422, 424, 426, 428. The plurality of data entries DATA distributed and stored in the plurality of edge-triggered latches 432, 434, 436, 438 are output to the output driver 130 in response to operations of the plurality of second switches 442, 444, 446, 448.

When each of the plurality of edge-triggered latches 432, 434, 436, 438 includes the D flip-flop (DFF), the pipe latch 400 can transmit or output the data entries in response to the clock signal CLK. However, the D flip-flop (DFF) is a component including multiple logic gates or multiple transistors. If the number of edge-triggered latches 432, 434, 436, 438 included in the pipe latch 400 increases, a size of the pipe latch 400 could increase and an amount of currents or power consumed by the pipe latch 400 may also increase.

Figure 4:
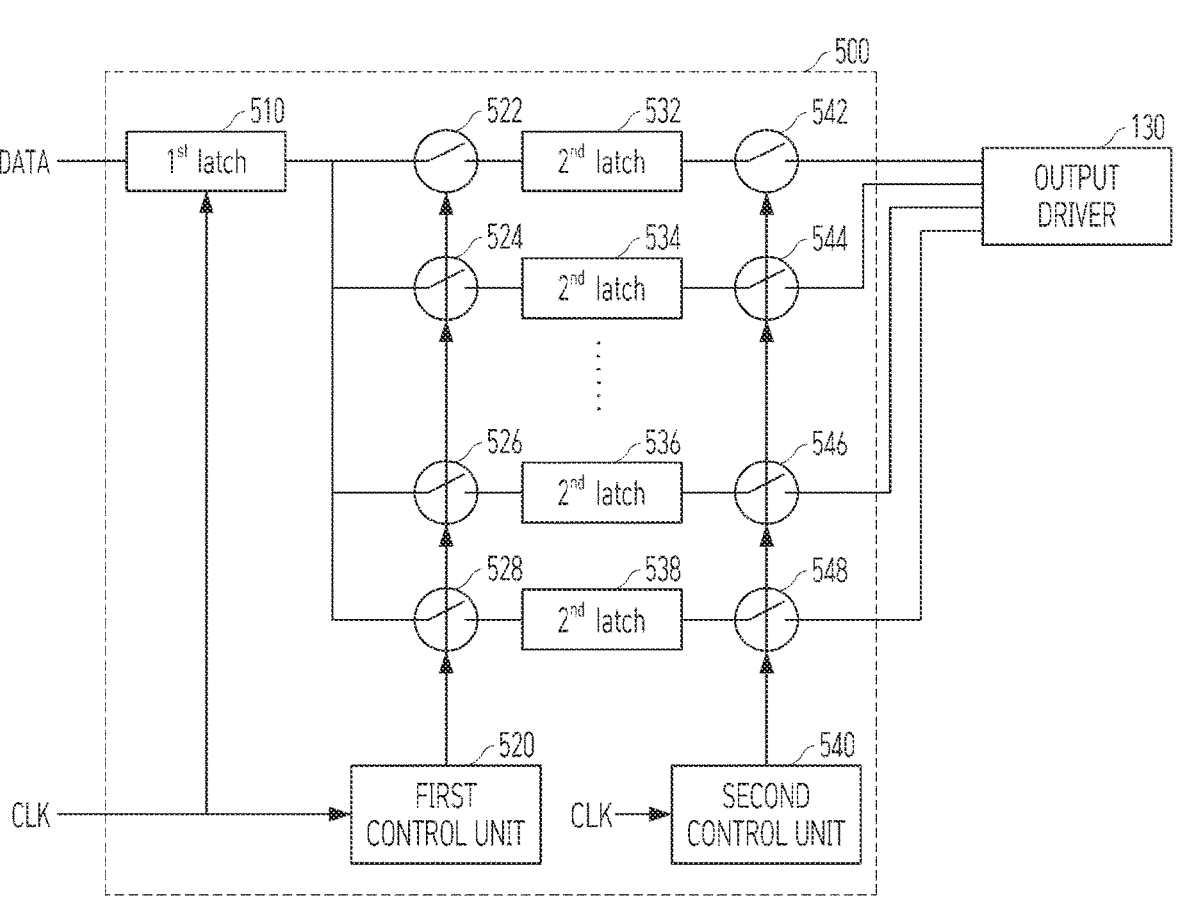
FIG. 4 illustrates a second embodiment of pipe latches according to the present disclosure.

FIG. 4 illustrates a second embodiment of pipe latches according to the present disclosure.

Referring to FIG. 4, a pipe latch 500 may include a first latch 510 and a plurality of second latches 532, 534, 536, 538. The plurality of second latches 532, 534, 536, 538 in the pipe latch 500 may be coupled to each other in parallel. The plurality of second latches 532, 534, 536, 538 are coupled between a plurality of first switches 522, 524, 526, 528 that control input of data entries, and a plurality of second switches 542, 544, 546, 548 that control output of stored data entries. Each of the plurality of second latches 532, 534, 536, 538 can store or transmit the data entries through the first switch and the second switch.

Comparing configurations described in FIGS. 3 and 4, combination of the first latch 510 and each of the plurality of second latches 532, 534, 536, 538 could correspond to each of the plurality of edge-triggered latches 432, 434, 436, 438. For example, the edge-triggered latch 432 could correspond to the first latch 510 and the second latch 532.

The pipe latch 500 can include a first control unit 520 and a second control unit 540. The first control unit 520 is configured to output a plurality of first control signals that control the plurality of first switches 522, 524, 526, 528. The second control unit 540 outputs a plurality of second control signals that control the plurality of second switches 542, 544, 546, 548. According to an embodiment, a plurality of first control signals and a plurality of second control signals may be respectively generated by the first control unit 520 and the second control unit 540 in response to the clock signal CLK.

When the data entries DATA are input to the first latch 510, the data entries may be temporarily stored in the first latch 510 in response to the clock signal CLK. The data entries temporarily stored in the first latch 510 may be distributed and stored in the plurality of second latches 532, 534, 536, 538 through the plurality of first switches 522, 524, 526, 528 in response to the plurality of first control signals output from the first control unit 520. The data entries distributed and stored in the plurality of second latches 532, 534, 536, 538 may be output to the output driver 130 through the plurality of second switches 542, 544, 546, 548 in response to the plurality of second control signals output from the second control unit 540.

Although there is only one first latch 510 in the pipe latch 500, the plurality of second latches 532, 534, 536, 538 may increase based on the number of pipe lines. Comparing configurations described in FIGS. 3 and 4, the size of the plurality of edge-triggered latches 432, 434, 436, 438 in the pipe latch 400 illustrated in FIG. 3 is larger than the size of the plurality of second latches 532, 534, 536, 538 in the pipe latch 500 illustrated in FIG. 4. Therefore, when the number of pipelines increases, the size (or planer size) increase of the plurality of second latches 532, 534, 536, and 538 can be smaller than that of the plurality of edge-triggered latches 432, 434, 436, 438. Even when the number of pipe lines is the same, not only is the size of the pipe latch 500 smaller than the size of the pipe latch 400, but also power consumption of the pipe latch 500 may be less than that of the pipe latch 400.

Figure 5:
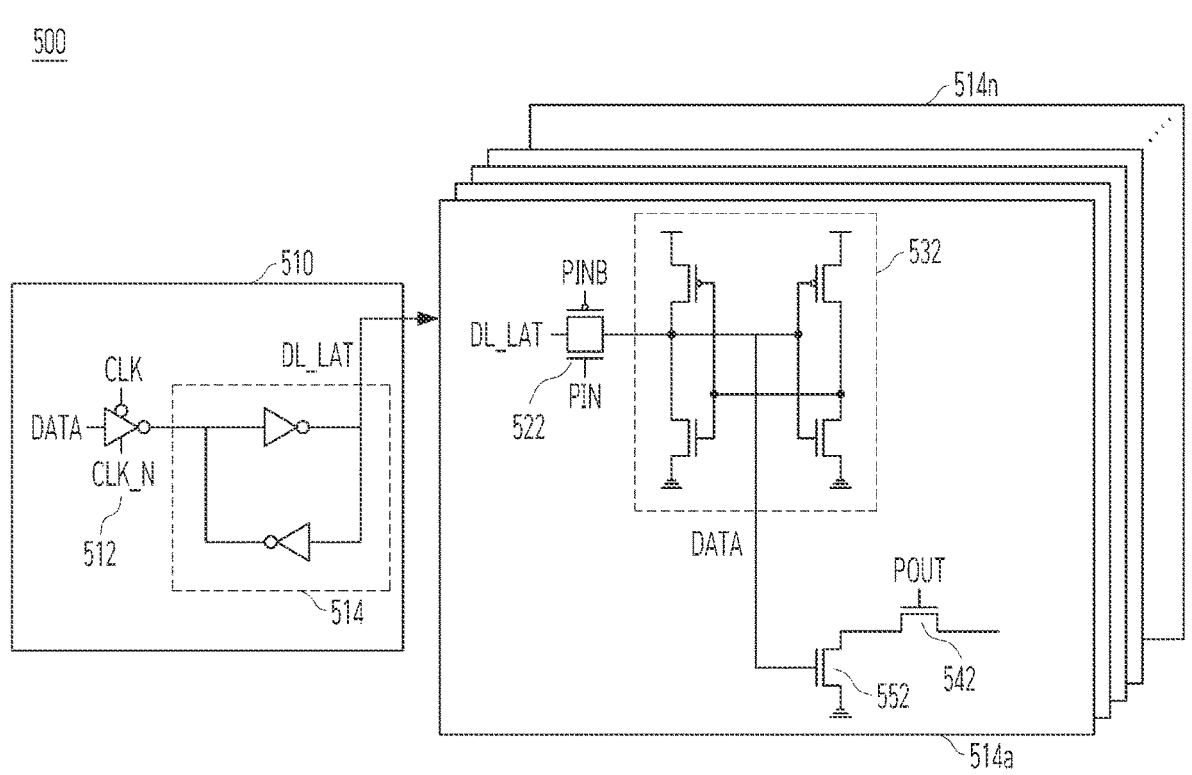
FIG. 5 illustrates a configuration of the pipe latch described in FIG. 4.

FIG. 5 illustrates a configuration of the pipe latch described in FIG. 4. FIG. 5 illustrates the first latch 510 and the plurality of pipe stage latches 514a, . . . , 514n in the pipe latch 500 described in FIG. 4. Here, the plurality of pipe stage latches 514a, . . . , 514n can correspond to circuits or logics including the plurality of first switches 522, 524, 526, 528, the plurality of second latches 532, 534, 536, 538, and the plurality of second switches 542, 544, 546, and 548.

Referring to FIG. 5, the first latch 510 may include a tri-state inverter 512 and a first inverter latch 514. The tri-state inverter 512 may control the connection between the first inverter latch 514 and the data entries DATA input in response to the clock signal CLK and an inverted clock signal CLK_N. The tri-state inverter 512 is a circuit that can output a signal state corresponding to one of two logical levels (high or low) or an effectively infinite impedance state (or 'off state') that separates the logic output from the logic input. The operation mode of the tri-state inverter 512 may be determined based on an input state of the clock signal CLK. For example, when the clock signal CLK is in a logic high state, a data entry may be transmitted to the first inverter latch 514.

A first pipe stage latch 514a may include a first pass gate 522, a second inverter latch 532, a first pull-down driver 552, and a first output switch 542.

The first pass gate 522 transmits, to the second inverter latch 532, the data entry DL_LAT temporarily stored in the first latch 510 in response to a pipe input signal PIN and an inverted pipe input signal PINB.

The first pull-down driver 552 may be driven in response to the data entry DATA stored in the second inverter latch 532. The first output switch 542 may output a value transmitted from the first pull-down driver 552 to an outside (e.g., another component) in response to a pipe output signal POUT. The first pull-down driver 552 may include an NMOS transistor. In FIG. 5, the first pull-down driver 552 is used as an example. According to an embodiment, the first pipe stage latch 514a may include a pull-up driver or both pull-down and pull-up drivers. The pull-up driver may include a PMOS transistor.

The second inverter latch 532 may include four cross-coupled transistors. For example, the second inverter latch 532 may include two PMOS transistors and two NMOS transistors. If the second inverter latch 532 includes four transistors, the number of components constituting the first pipe stage latch 514a might be not increased. Accordingly, even if the plurality of pipe stage latches 514a to 514n in the pipe latch 500 increases, the overall size of the pipe latch 500 might not increase significantly.

According to an embodiment, the first inverter latch 514 and the second inverter latch 532 might be implemented with the same configuration. Through this, the number of transistors included in the pipe latch 500 could be reduced.

Figure 6:
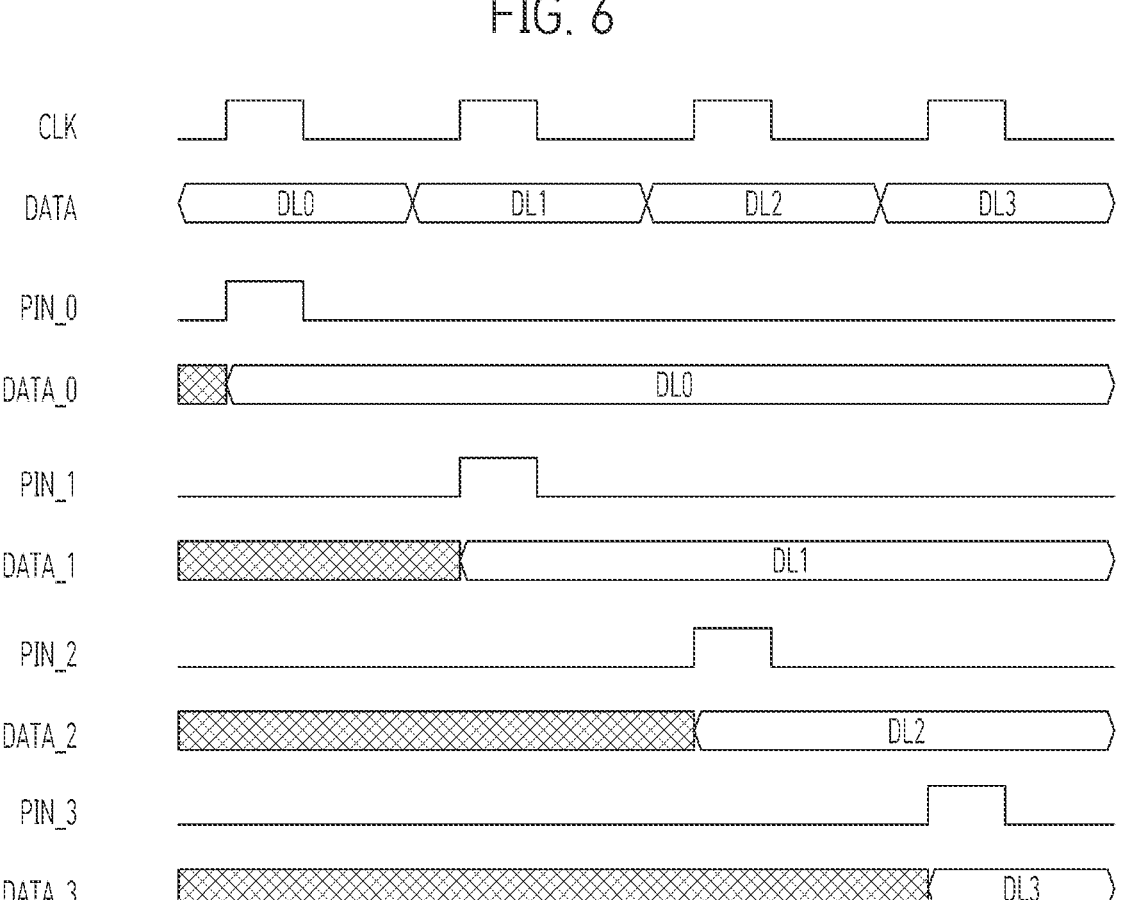
FIG. 6 is a timing diagram illustrating an operation of the pipe latch described in FIGS. 4 and 5.

FIG. 6 is a timing diagram illustrating an operation of the pipe latch described in FIGS. 4 and 5.

Referring to FIG. 6, a clock signal CLK and data entries DL0, DL1, DL2, DL3 may be input to the pipe latch 500.

The pipe latch 500 can include first to fourth pipe stage latches corresponding to the plurality of second latches 532, 534, 536, 538 described in FIG. 4. The pipe latch 500 may generate a plurality of pipe input signals PIN_0, PIN_1, PIN_2, PIN_3 in response to the clock signal CLK. The plurality of pipe input signals PIN_0, PIN_1, PIN_2, PIN_3 may be sequentially activated in response to a cycle of the clock signal CLK. In response to the first pipe input signal PIN_0, the first data entry DL0 may be stored in the first pipe stage latch 514a. In response to the second pipe input signal PIN_1, the second data entry DL1 may be stored in the second pipe stage latch. In response to the third pipe input signal PIN_2, the third data entry DL2 may be stored in the third pipe stage latch. In response to the fourth pipe input signal PIN_3, the fourth data entry DL3 may be stored in the fourth pipe stage latch.

In FIG. 6, the plurality of pipe input signals PIN_0, PIN_1, PIN_2, PIN_3 is described as an example in which the plurality of pipe input signals PIN_0, PIN_1, PIN_2, PIN_3 is activated in every cycle of the clock signal CLK, but this may vary depending on the embodiment. For example, whenever a logic state of the clock signal CLK changes or transitions (e.g., twice in each cycle), the plurality of pipe input signals PIN_0, PIN_1, PIN_2, PIN_3 may be activated.

According to an embodiment, the plurality of second control signals that control the plurality of second switches 542, 544, 546, 548 described in FIG. 4 could also be activated sequentially, like the plurality of pipe input signals PIN_0, PIN_1, PIN_2, PIN_3.

The plurality of pipe stage latches 514a, . . . , 514n may maintain (i.e. temporarily store) a data entry after the data entry is input until the data entry is output. Additionally, after new data entries are input to the plurality of pipe stage latches 514a, . . . , 514n, the plurality of pipe stage latches 514a, . . . , 514n could maintain the input new data entries until other new data entries are input.

As above described, an edge-triggered latch according to an embodiment of the present disclosure can be used to ensure stable and accurate data transmission and reception in a memory device or a memory system that operates at high speed. For example, in memory systems or digital communication systems, data entries are transmitted at very high speeds. The edge-triggered latch can recognize or sample an incoming data entry at a precise interval or cycle (determined by a clock signal). For example, by triggering on an edge (i.e., state transition) of the clock signal, the edge-triggered latch may ensure that the edge-triggered latch samples a data entry at a consistent time.

According to an embodiment, the memory system may reduce errors occurring in internal operations by synchronizing data entries according to a reference clock signal, an internal clock signal generated in response to the reference clock signal, or the like. Edge-triggered latches can synchronize the data entries in response to the reference clock signal, suppressing errors that may occur during internal operations. Additionally, according to an embodiment, the edge-triggered latch may convert data entries serially transmitted at high speed into a parallel format for data processing or may be used to buffer data entries to compensate for a difference in operating speeds of at least two components within a memory device or memory system.

As above mentioned, an edge-triggered latch can maintain, enhance, and improve operational reliability or performance of the memory device or the memory system operating at high speed in a low-power environment by providing precise control when a logical value or a state of an input/output data entry changes depending on an edge of an external clock signal.

As above described, parallelism of data processing of a memory device or a memory system according to an embodiment of the present disclosure can be improved.

Additionally, a size and/or power consumption of the pipe latch in the memory device or the memory system according to an embodiment of the present disclosure can be reduced.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the present disclosure as defined in the following claims. Furthermore, the embodiments may be combined to form additional embodiments.

What is claimed is:

1. A pipeline system comprising:
a first inverter latch configured to receive plural data entries sequentially input;
plural second inverter latches coupled to each other in parallel for storing the plural data entries input from the first inverter latch in a distributive manner;
plural first switches arranged between the first inverter latch and each of the plural second inverter latches, each first switch configured for controlling transmission of each of the plural data entries from the first inverter latch to one of the plural second inverter latches;
plural second switches configured to output the plural data entries stored in the plural second inverter latches; and
a tri-state inverter configured to control transmission of the plural data entries into the first inverter latch based on a clock signal.

2. The pipeline system according to claim 1, wherein each of the plural first switches comprises a pass gate operating in response to a pipe input signal and an inverted pipe input signal.

3. The pipeline system according to claim 1, wherein the plural first switches are controlled by plural pipe input signals which are sequentially activated based on the clock signal.

4. The pipeline system according to claim 1, wherein each of the plural second switches comprises a transistor operating in response to a pipe output signal.

5. The pipeline system according to claim 1, wherein the first inverter latch and the plural second inverter latches have a substantially same structure.

6. The pipeline system according to claim 1, wherein each of the second inverter latches comprises:
four transistors including each two transistors having gates cross-coupled to each other; and
a pull-down driver coupled to the four transistors.

7. The pipeline system according to claim 6, wherein the pull-down driver comprises an NMOS transistor.

8. The pipeline system according to claim 6, wherein the four transistors comprise two PMOS transistors and two NMOS transistors.

9. A memory device comprising a first input and output circuit configured to input or output plural data entries to or from a cell array comprising plural memory cells;

a pipe latch coupled to the first input and output circuit and configured to perform a parallel processing of the plural data entries based on a clock signal; and a second input and output circuit coupled to the pipe latch and configured to input or output the plural data entries, wherein the pipe latch comprises:

a first inverter latch configured to receive the plural data entries sequentially input;

plural second inverter latches coupled in parallel and configured to store the plural data entries input from the first inverter latch in a distributive manner and output the stored plural data entries; and a tri-state inverter configured to control transmission of the plural data entries into the first inverter latch based on the clock signal.

10. The memory device according to claim 9, wherein the pipe latch comprises:

plural first switches arranged between the first inverter latch and the plural second inverter latches, each first switch configured for controlling transmission of each of the plural data entries from the first inverter latch to one of the plural second inverter latches; and plural second switches configured to output the plural data entries stored in the plural second inverter latches.

11. The memory device according to claim 10, wherein each of the plural first switches comprises a pass gate operating in response to a pipe input signal and an inverted pipe input signal.

12. The memory device according to claim 10, wherein the plural first switches are controlled by plural pipe input signals which are sequentially activated based on the clock signal.

13. The memory device according to claim 10, wherein each of the plural second switches comprises a transistor operating in response to a pipe output signal.

14. The memory device according to claim 10, wherein the first inverter latch and each of the plural second inverter latches have a substantially same structure.

15. The memory device according to claim 10, wherein each of the second inverter latches comprises:

four transistors including each two transistors having gates cross-coupled to each other; and a pull-down driver coupled to the four transistors.

16. The memory device according to claim 15, wherein the pull-down driver comprises an NMOS transistor.

17. The memory device according to claim 15, wherein the four transistors comprise two PMOS transistors and two NMOS transistors.

18. The memory device according to claim 9, wherein the first input and output circuit comprises a sense amplifier, and the second input and output circuit comprises a chip select decoder.

\*    \*    \*    \*    \*